United States Patent [19]

Zaccherini

[11] Patent Number: 5,436,177
[45] Date of Patent: Jul. 25, 1995

[54] PROCESS FOR FORMING IMPLANTED REGIONS WITH LOWERED CHANNELING RISK ON SEMICONDUCTORS

[75] Inventor: Chiara Zaccherini, Milan, Italy

[73] Assignee: SGS-Thomson Microelectronics S.r.l., Agrate Brianza, Italy

[21] Appl. No.: 106,037

[22] Filed: Aug. 12, 1993

[30] Foreign Application Priority Data

Aug. 19, 1992 [IT] Italy .................................. MI92A2003

[51] Int. Cl.6 ........................................... H01L 21/22
[52] U.S. Cl. ......................................... 437/27; 437/46; 437/60; 437/918
[58] Field of Search ........................ 437/27, 46, 47, 60, 437/918; 148/DIG. 136

[56] References Cited

U.S. PATENT DOCUMENTS

| 4,208,781 | 6/1980 | Rao et al. | 437/46 |
| 4,290,185 | 9/1981 | McKenwy et al. | 437/46 |
| 4,367,580 | 1/1983 | Guterman | 437/46 |
| 4,391,650 | 7/1983 | Pfeifer et al. | 437/46 |
| 4,629,520 | 12/1986 | Ueno et al. | 437/27 |
| 4,866,002 | 9/1989 | Shizukuishi et al. | 437/46 |
| 4,916,507 | 6/1990 | Boudou et al. | 437/27 |
| 5,141,597 | 8/1992 | Adams et al. | 437/918 |
| 5,185,285 | 2/1993 | Hasaka | 437/46 |
| 5,204,279 | 4/1993 | Chan et al. | 437/918 |
| 5,236,857 | 8/1993 | Eklund et al. | 437/918 |
| 5,304,502 | 4/1994 | Hanagasaki | 437/918 |

FOREIGN PATENT DOCUMENTS 55-107244  8/1980  Japan .................................. 437/46

Primary Examiner—Olik Chaudhuri
Assistant Examiner—S. Mulpuri
Attorney, Agent, or Firm—Wolf, Greenfield & Sacks

[57] ABSTRACT

A process for forming implanted regions with lowered channelling risk on semiconductors, wherein the semiconductor devices include at least one layer of polycrystalline silicon which covers all isolation regions and active areas which are liable to a channelling phenomena and wherein the process includes masking the areas or regions to be implanted on the polycrystalline layer, implanting a first dopant species having a high atomic weight to amorphousize the polycrystalline silicon in any unmasked areas, removing the masking layer, and implanting a second dopant species over the entire semiconductor.

14 Claims, 6 Drawing Sheets

PROCESS FOR FORMING IMPLANTED REGIONS WITH LOWERED CHANNELING RISK ON SEMICONDUCTORS

BACKGROUND OF THE INVENTION

1. Field of the Invention

This invention relates to a process for forming implanted regions with lowered channeling risk on semiconductors. More specifically, the invention concerns a process applied to semiconductor electronic devices having at least one layer of polycrystalline silicon which covers both isolation regions and active areas liable to channelling phenomena. In particular the process relates to the formation of resistors in doped polycrystalline silicon.

2. Discussion of the Related Art

As is well known, in the manufacture of several semiconductor electronic devices, and specifically the manufacture of static random access memories (SRAMs), ample recourse is made to ion implantation techniques for doping both buried regions of the semiconductor and thin polycrystalline layers.

Such is the case, for instance, with the formation of resistors in thin polysilicon films covering active areas and/or isolation regions of a SRAM storage cell. These resistors are generally formed by implantation in the polycrystalline layer covering the so-called field oxide regions which are located at the boundaries of the active channel region of a field-effect transistor constituting said storage cell.

Normally, such resistors are formed by implanting boron ions in the thin polycrystalline film. However, during the implantation step, there may occur a so-called channelling phenomena, wherein some ions are channelled along preferential directions defined by the crystalline nature of the film and which penetrate the semiconductor as far as the substrate underlying the polycrystalline layer, thereby altering the electric characteristics of the device.

The extent of the channelling phenomenon is tied to various parameters, such as the thickness of the thin film, atomic species implanted, and implanting energy. Boron is, in fact, one of the atomic species which is most susceptible to the channelling phenomenon.

In many cases, the phenomenon is enhanced by the size of the grains which make up the thin polycrystalline layer. The size of these grains is generally of a comparable order to the layer thickness dimension. As an example, note that channelling phenomena have been detected in a substrate with boron implantations performed at 25 keV on polycrystalline silicon 2000-Angstrom thick.

To obviate this serious drawback, the prior art has proposed a first method which consists of implanting different species effective to make the polycrystalline layer somehow "amorphous", thereby reducing the proportion of dopant affected by the channelling phenomenon. It has been found, for instance, that an implantation of boron fluoride (BF2) can achieve a dual goal. It quickly amorphousizes the polysilicon thus attenuating the channeling risk, and it still allows the resistor implantation. However, this prior art method has a drawback in that fluorine ions which are left in the polycrystalline layer harm the electrical characteristics of the resistors formed therein.

A second prior art proposed method requires an oxidation of the polycrystalline silicon before the resistors are implanted. In fact, the oxide layer can effectively randomize the trajectory of the incident ions thus reducing the proportion of dopant effected by channeling. It will be appreciated, however, that this second proposed method introduces an additional process step, resulting in a more costly process of manufacture of the corresponding devices.

Another proposed method could be that of masking the areas of the device which are not to be implanted by the resistor implantation step, using a photoresist. However, this method would also introduce a cost-intensive additional step in the manufacturing process.

Accordingly, it is an object of this invention is to provide a process for forming implanted regions with low channelling risk, wherein the process includes peculiar functional features to effectively overcome the above-mentioned drawbacks associated with the prior art methods.

SUMMARY OF THE INVENTION

The present invention comprises a method of manufacturing semiconductor devices by providing a selectively polysilicon pre-amorphsized layer limited to specific areas of the semiconductor device.

The features and advantages of a process according to the invention will become apparent from the following description of an embodiment thereof, given by way of example and not of limitation with reference to the steps of making a semiconductor electronic device as illustrated by the accompanying drawings.

DETAILED DESCRIPTION

Figure 1:
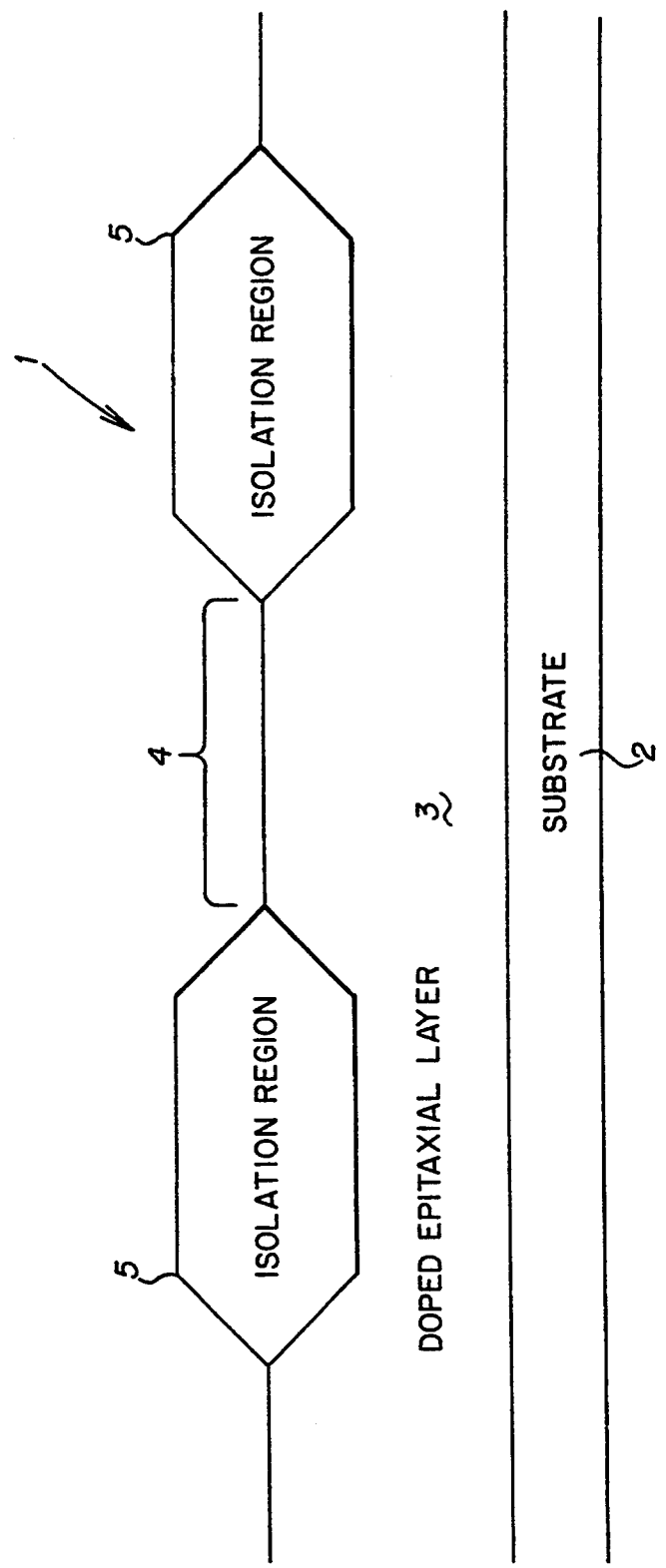
FIGS. 1 to 4 are cross sectional views of a semiconductor device showing, the semiconductor electronic device being subjected to various steps of the process according to this invention.

With reference to FIG. 1, generally and schematically shown at 1 is a semiconductor electronic device formed on a monocrystalline silicon substrate or wafer 2. In this specific case, the device 1 is a field-effect transistor intended for forming a static random access storage cell, e.g. of the type known as SRAM (Static Random Access Memory).

The transistor 1 is formed on an N- doped epitaxial layer 3 which covers the substrate 2. A channel region 4 is defined in the epitaxial layer 3 and is limited by opposite isolation regions 5 comprising so-called field oxide. Understandably, the transistor 1 also includes so-called drain and source active areas, not shown because these would only be visible in a different vertical cross-section plane from that shown in FIGS. 1 to 6.

Figure 2:
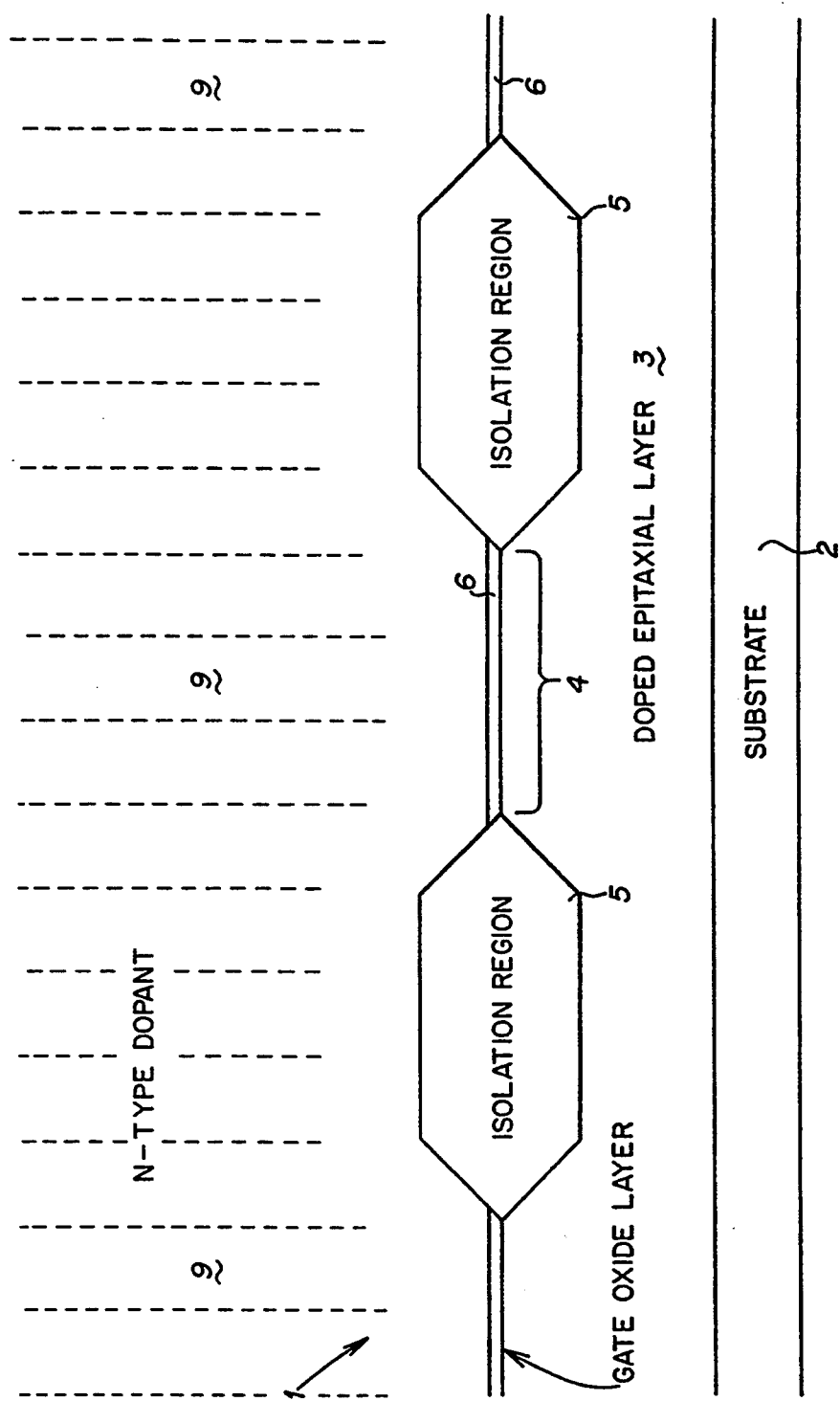

Referring to FIG. 2, a thin layer of gate oxide 6 is grown on the channel region 4, to a thickness within the range of 100 to 200 Angstroms. The process according to this invention provides, at this point, a channel region 4 implanting step. This is a conventional step which is carried out using a dopant 9 of the N type, e.g., phosphorous.

Figure 3:
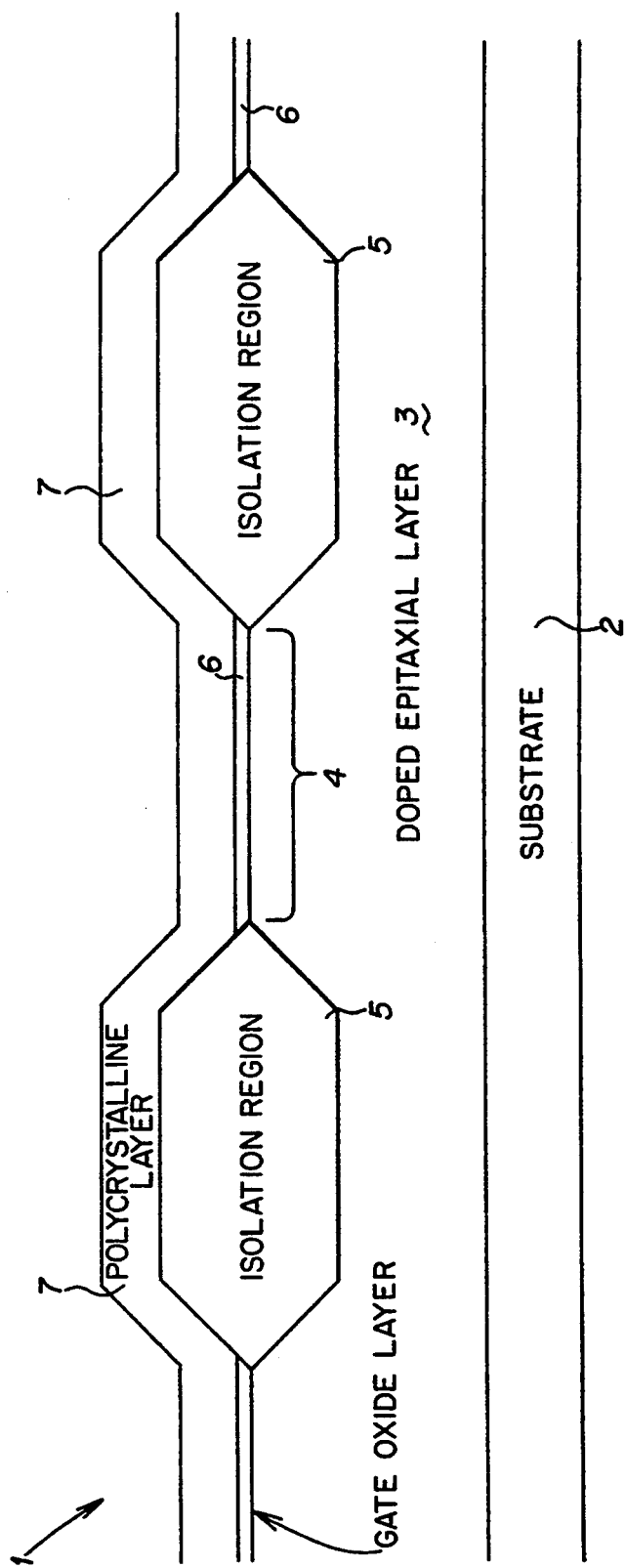

Referring to FIG. 3, the basic structure described thus far is covered with a polycrystalline silicon layer 7 having a thickness of few thousands of Angstroms, e.g. 2000 Angstroms. Above the channel region 4, this polycrystalline layer 7 provides the gate terminal for the transistor 1.

More particularly, and depending on the processes used to manufacture SRAM storage devices, the polycrystalline layer 7 may serve various functions. It is worth noting, for example, that the areas overlying the gate oxide 6 are usually intended for forming the gate electrode, and the areas overlying the field oxide 5 for forming resistors, while other regions overlying field oxide may be used to establish local interconnections.

Figure 4:
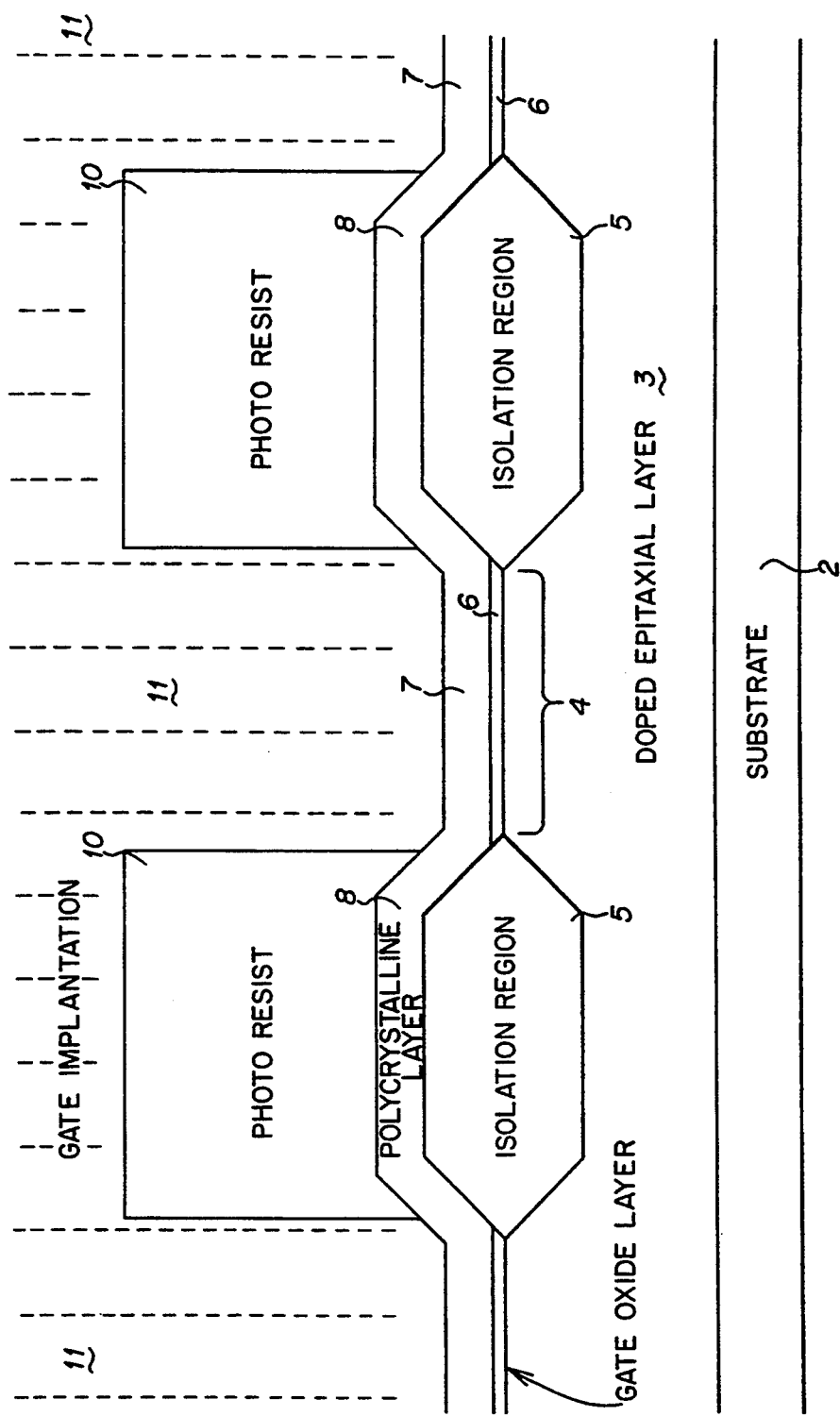

Referring to FIG. 4, the process according to the present invention now provides for the step of ion implantation of predetermined areas 8 of the polycrystalline layer 7 overlying the field oxide 5. Such areas are intended for forming P-doped resistors. This is accomplished by first placing a masking layer over the areas 8 in which said resistors are to be formed. Masking these areas may be performed conventionally by means of a photoresist layer.

Subsequently, in accordance with the present invention, a heavy implantation of the unmasked areas is performed using a dopant species 11 of the N type which has a high atomic weight, such as arsenic or phosphorous. Preferably, the implant dosage is selected to be in a range between $1 \times 10^{15}$ and $1 \times 10^{16}$ ions/cm2. However, an implant dosage at higher or different concentrations is also contemplated by the present invention, e.g. in the range $5 \times 10^{14}$ to $1 \times 10^{16}$ ions/cm2.

Figure 5:
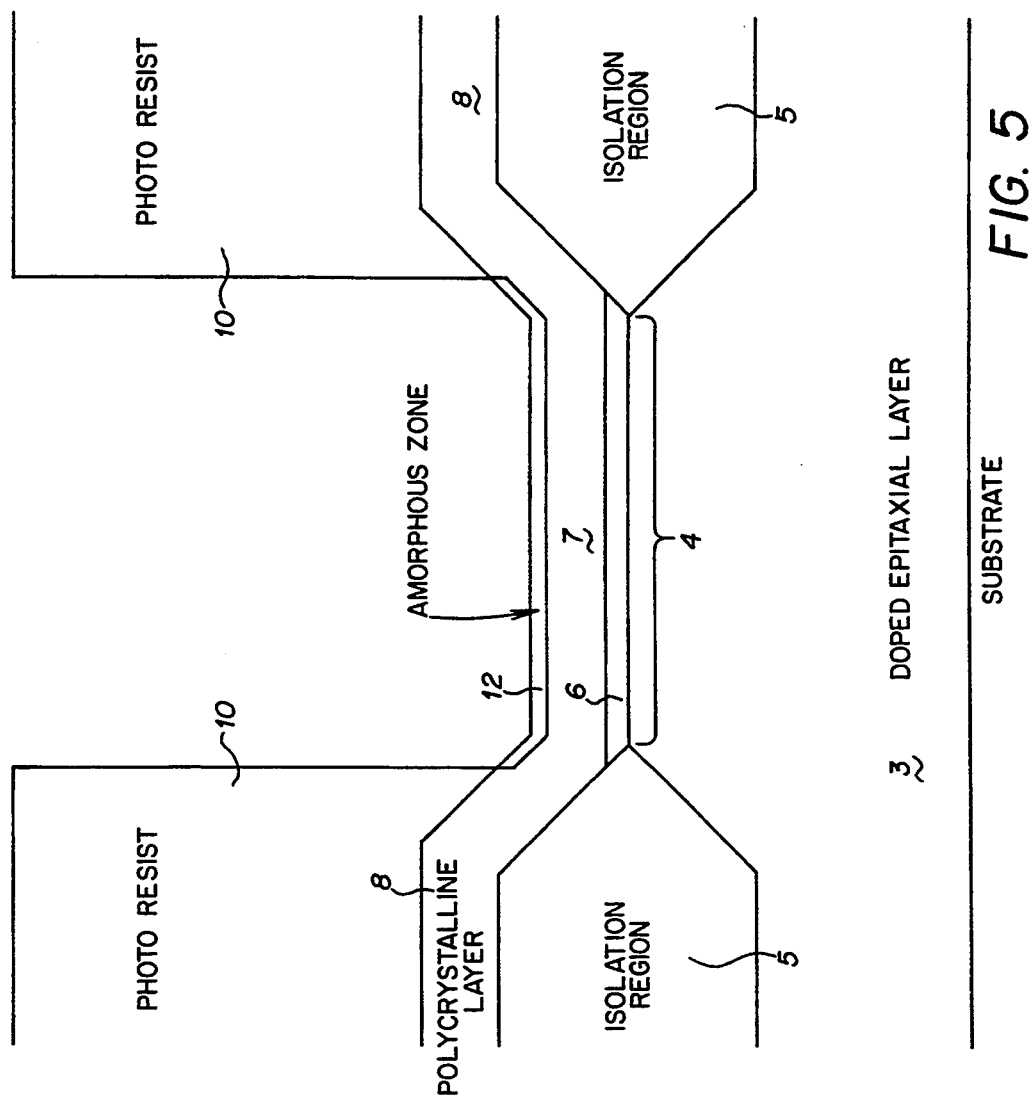
FIG. 5 is an enlarged view, of the device as shown in FIG. 4.

Referring to FIG. 5, this heavy implantation step causes the polycrystalline layer 7 which overlies the channel region 4 of the device 1 and is unprotected by the photoresist 10 to become amorphous. Thus, in essence, an amorphousized zone 12 is provided in the polycrystalline layer 7 directly over the channel region 4. This implantation step also enables the gate region of the device 1 to be doped. Accordingly, the process of this invention will keep the number of the steps required to form the storage cell in MOS technology unaltered. Thus, the present invention method is more economical than the prior art methods.

Figure 6:
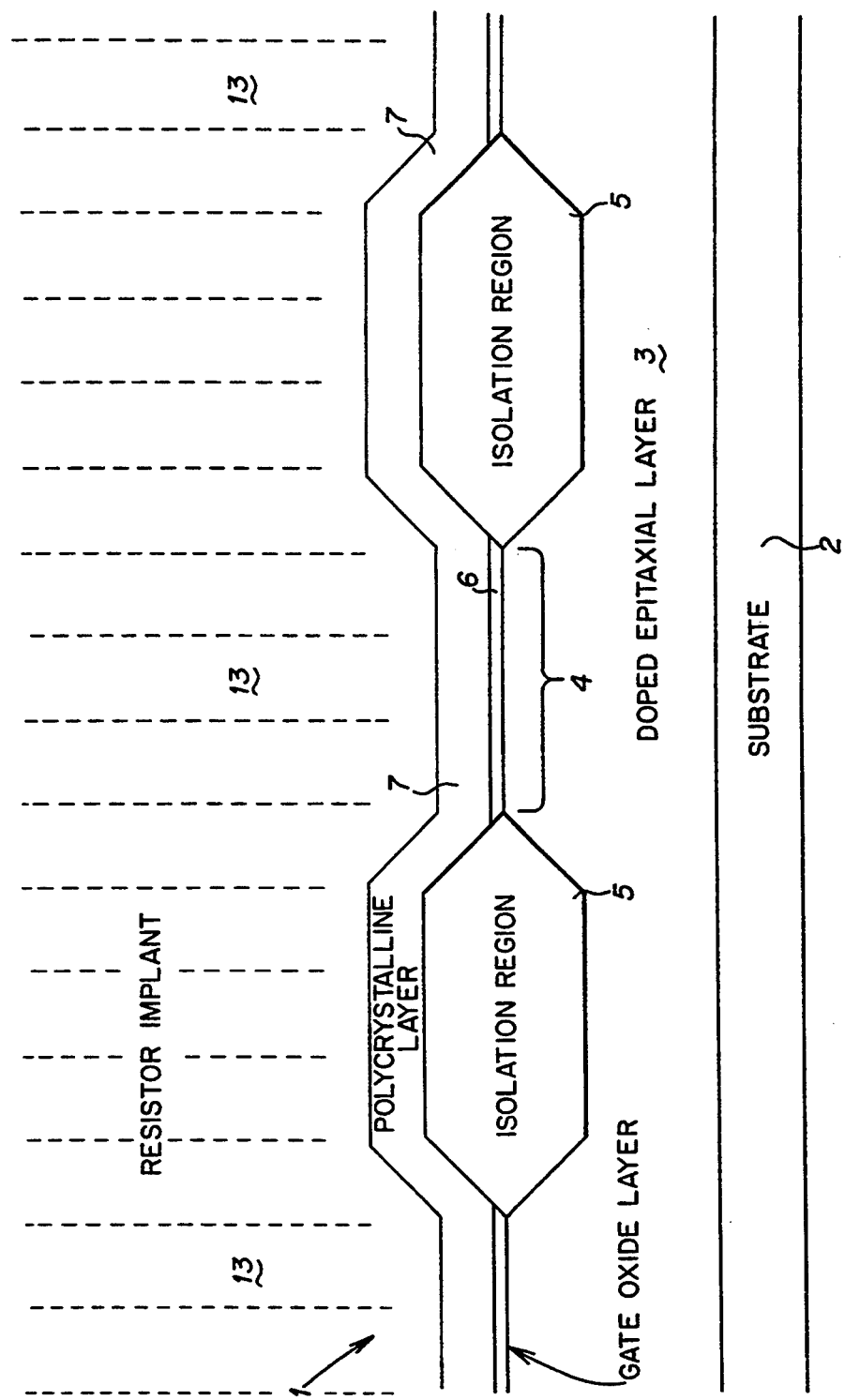
FIG. 6 is another view of the device as shown in FIGS. 1 to 4, showing a final implementation step of the process according to the present invention.

The final step of the process according to the present invention is a step of doping the resistors 8 by implantation as shown in FIG. 6. However, this step is preceded by removal of the photoresist 10 which protected the areas reserved for such resistors. The doping step is carried out using a medium or low dosage of a dopant 13 of the P type, such as boron. Preferably, the implant dosage is selected between $1 \times 10^{12}$ and $1 \times 10^{15}$ ions/cm2. The dopant is applied across the entire wafer using no masking step.

Basically, the two last-named steps of the inventive process will provide, first, selective pre-amorphousization of just those areas which might be affected by the channelling phenomenon, and then controlled implantation of the polycrystalline layer for forming the resistors. It should be pointed out that the pre-amorphousization of the polycrystalline layer is performed in all the zones overlying active areas, where the channelling phenomenon could cause harm.

The process of this invention does solve the technical problems associated with the prior art methods and also affords a number of advantages. For example, the channelling risk during resistor implantation is minimized, without burdening the process with additional steps. In addition, the process according to the present invention avoids the introduction in the semiconductor device of atomic species which are not strictly required for making the various discrete active areas.

Of course, the process of this invention may be changed and modified within the scope of protection contemplated by this invention. In particular, the atomic species utilized in the two discrete implantation steps could be phosphorous and antimony, and accordingly, the N or P types of the affected area dopings would be reversed from the embodiment described above.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A process for forming implanted regions on semiconductor devices with lowered channelling risk, wherein the semiconductor electronic devices include at least one layer of polycrystalline silicon which covers at least two isolation regions and an active area liable to a channelling phenomena, comprising the steps of:
   depositing a masking layer on said isolation regions covered by said polycrystalline layer;
   implanting a first dopant species, in any unmasked areas of the semiconductor devices, to amorphousize any unmasked polycrystalline silicon areas;
   removing the masking layer; and
   implanting a second dopant species over the entire polycrystalline silicon layer to form resistors over the isolation regions.

2. The process according to claim 1, wherein the first dopant species is an N-type dopant.

3. The process according to claim 1, wherein the second dopant species is a P-type dopant.

4. The process according to claim 1, wherein an implant dosage of the first dopant implanting step is within the range from $5 \times 10^{14}$ to $1 \times 10^{16}$ ions/cm$^2$.

5. The process according to claim 1, wherein an implant dosage of the second dopant implanting step is within the range from $1 \times 10^{12}$ to $1 \times 10^{15}$ ions/cm$^2$.

6. The process according to claim 1, wherein the masking step is performed using a photoresist layer.

7. The process according to claim 1, wherein the first dopant implanting step is carried out using arsenic ions.

8. The process according to claim 1, wherein the first dopant implanting step is carried out using phosphorous ions.

9. The process according to claim 1, wherein the second dopant implanting step is carried out using boron ions.

10. The process according to claim 1, wherein the claimed steps are performed in sequence.

11. The process according to claim 1, wherein the first dopant species is a P-type dopant.

12. The process according to claim 1, wherein the second dopant species is an N-type dopant.

13. The process according to claim 11, wherein the first dopant species comprises boron ions.

14. The process according to claim 12, wherein the second-dopant species comprises phosphorous ions.

* * * * *